United States Patent
Hiramoto et al.

(10) Patent No.: US 9,462,254 B2
(45) Date of Patent: Oct. 4, 2016

(54) LIGHT FIELD IMAGE CAPTURE DEVICE AND IMAGE SENSOR

(71) Applicant: PANASONIC CORPORATION, Osaka (JP)

(72) Inventors: Masao Hiramoto, Osaka (JP); Yasunori Ishii, Osaka (JP); Yusuke Monobe, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 331 days.

(21) Appl. No.: 13/997,293

(22) PCT Filed: Jan. 16, 2013

(86) PCT No.: PCT/JP2013/000148
§ 371 (c)(1),
(2) Date: Jun. 24, 2013

(87) PCT Pub. No.: WO2013/118428
PCT Pub. Date: Aug. 15, 2013

(65) Prior Publication Data
US 2014/0078259 A1  Mar. 20, 2014

(30) Foreign Application Priority Data

Feb. 8, 2012  (JP) ................ 2012-024926

(51) Int. Cl.
*H04N 13/02* (2006.01)
*H01L 27/146* (2006.01)
*H04N 5/374* (2011.01)

(52) U.S. Cl.
CPC ........ *H04N 13/021* (2013.01); *H01L 27/1464* (2013.01); *H01L 27/14627* (2013.01); *H01L 27/14629* (2013.01); *H04N 5/374* (2013.01)

(58) Field of Classification Search
CPC .................. H01L 27/14627; H01L 27/14629; H01L 27/1464; H01L 13/21; H01L 5/374
USPC ......................................................... 348/46
See application file for complete search history.

(56) References Cited

U.S. PATENT DOCUMENTS

| 5,657,037 A * | 8/1997 | Okada ............ G09G 3/20 345/78 |
| 2002/0171740 A1 | 11/2002 | Seo |
| 2009/0078973 A1 * | 3/2009 | Hsu et al. .............. 257/292 |

(Continued)

FOREIGN PATENT DOCUMENTS

| JP | 62-217790 A | 9/1987 |
| JP | 62-291292 A | 12/1987 |

(Continued)

OTHER PUBLICATIONS

International Search Report for corresponding International Application No. PCT/JP2013/000148 mailed Feb. 19, 2013.

(Continued)

*Primary Examiner* — Jamie Atala
*Assistant Examiner* — Boubacar Abdou Tchoussou
(74) *Attorney, Agent, or Firm* — Renner, Otto, Boisselle & Sklar, LLP

(57) ABSTRACT

An image sensor 2 includes: a photoelectric conversion layer 1*d* including a plurality of photosensitive cells; a reflective layer 1*c* that reflects light that has been transmitted through the photoelectric conversion layer 1*d*; a micro lens layer 1*a* that includes a plurality of micro lenses that are arranged between the photoelectric conversion layer 1*d* and the reflective layer 1*c*; and a transmitted light controlling layer 1*b* that is arranged between the photoelectric conversion layer 1*d* and the reflective layer 1*c* and that is able to change optical transmittance in accordance with an instruction given by a controller. The micro lens layer 1*a* is arranged so that light that has been transmitted through one of the photosensitive cells and then reflected from the reflective layer 1*c* is incident on the same photosensitive cell again.

6 Claims, 4 Drawing Sheets

(56) References Cited

U.S. PATENT DOCUMENTS

| | | | | |
|---|---|---|---|---|
| 2009/0079849 | A1* | 3/2009 | Kondo | 348/231.99 |
| 2009/0284627 | A1 | 11/2009 | Bando et al. | |
| 2010/0066812 | A1* | 3/2010 | Kajihara et al. | 348/46 |
| 2011/0266421 | A1* | 11/2011 | Nozaki | H01L 27/14685 250/216 |
| 2012/0162390 | A1* | 6/2012 | Chang | H04N 13/0271 348/49 |
| 2012/0197077 | A1* | 8/2012 | Kaku | 600/109 |

FOREIGN PATENT DOCUMENTS

| | | |
|---|---|---|
| JP | 11-098532 A | 4/1999 |
| JP | 2002-344999 A | 11/2002 |
| JP | 2003-134533 A | 5/2003 |
| JP | 2006-261372 A | 9/2006 |
| JP | 2008-167395 A | 7/2008 |
| JP | 2008-294741 A | 12/2008 |
| JP | 2009-017079 A | 1/2009 |
| JP | 2009-169025 A | 7/2009 |
| JP | 2009-276294 A | 11/2009 |
| JP | 2010-118412 A | 5/2010 |

OTHER PUBLICATIONS

Ren Ng, et al., "Light Field Photography with a Hand-held Plenoptic Camera", Stanford Tech Report CTSR Feb. 2005.

* cited by examiner

LIGHT FIELD IMAGE CAPTURE DEVICE AND IMAGE SENSOR

TECHNICAL FIELD

The present application relates to a single-lens 3D image capturing technology for obtaining an image and depth information at the same time.

BACKGROUND ART

Recently, the performance and functionality of digital cameras and digital movie cameras that use some solid-state image sensor such as a CCD or a CMOS (which will be sometimes simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. As a result, the resolution of an image sensor has lately increased rapidly from around one million pixels to ten million or more pixels in a matter of few years. On top of that, the quality of an image captured has also been improved significantly as well. As for display devices, on the other hand, LCD and plasma displays with a reduced depth now provide high-resolution and high-contrast images, thus realizing high performance without taking up too much space. And such video quality improvement trends are now spreading from 2D images to 3D images. In fact, 3D display devices that achieve high image quality although they require the viewer to wear a pair of polarization glasses have been developed just recently.

As for the 3D image capturing technology, a typical 3D image capture device with a simple arrangement uses an image capturing system with two cameras to capture a right-eye image and a left-eye image. According to such a so-called "two-lens image capturing" technique, however, two cameras need to be used, thus increasing not only the overall size of the image capture device but also the manufacturing cost as well. To overcome such a problem, methods for capturing multiple images with parallax (which will be sometimes referred to herein as a "multi-viewpoint image") by using a single camera have been researched and developed. Such a method is called a "single-lens image capturing method".

For example, Patent Documents Nos. 1 and 2 disclose a method for obtaining a multi-viewpoint image by using two polarizers, of which the transmission axes cross each other at right angles, and a rotating polarization filter. Meanwhile, Patent Documents Nos. 3 to 5 disclose a method for obtaining a multi-viewpoint image by using a diaphragm (light beam confining plate) with multiple color filters.

The methods disclosed in these Patent Documents Nos. 1 to 5 are used mostly to generate a multi-viewpoint image using a single-lens camera. On the other hand, there is a technique for getting depth information using a single-lens camera with multiple micro lenses and for changing the focus position of the image captured freely based on that information. Such a technique is called "light field photography" and a single-lens camera that uses such a technique is called a "light field camera". In a light field camera, a number of micro lenses are arranged on an image sensor. Each of those micro lenses is arranged so as to cover a plurality of pixels. By calculating information about the direction of incoming light based on the image information gotten through the image capturing session, the subject's depth can be estimated. Such a camera is disclosed in Non-Patent Document No. 1, for example.

Patent Document No. 6 discloses a technique for increasing the resolution using two image capturing systems. According to such a technique, the incoming light is split into two divided incoming light beams, which are imaged by two image capturing systems, of which the groups of micro lenses are arranged so as to spatially shift from each other by a half pitch, and then the images captured in this manner are synthesized together, thereby increasing the resolution.

On the other hand, Patent Document No. 7 discloses a technique for changing the modes of operation from a normal shooting mode into the light field photography mode, or vice versa, using a single image capturing system. According to this technique, a micro lens, of which the focal length varies according to the voltage applied, is used. Specifically, the focal length of the micro lens is set to be the infinity in the former mode and set to be a predetermined length in the latter mode. By adopting such a mechanism, an image with high resolution and depth information can be obtained.

CITATION LIST

Patent Literature

Patent Document No. 1: Japanese Laid-Open Patent Publication No. 62-291292
Patent Document No. 2: Japanese Laid-Open Patent Publication No. 62-217790
Patent Document No. 3: Japanese Laid-Open Patent Publication No. 2002-344999
Patent Document No. 4: Japanese Laid-Open Patent Publication No. 2009-276294
Patent Document No. 5: Japanese Laid-Open Patent Publication No. 2003-134533
Patent Document No. 6: Japanese Laid-Open Patent Publication No. 11-98532
Patent Document No. 7: Japanese Laid-Open Patent Publication No. 2008-167395

NON-PATENT LITERATURE

Non-Patent Document No. 1: Ren Ng et al., "Light Field Photography with a Hand-held Plenoptic Camera", Stanford Tech Report CTSR 2005-02

SUMMARY OF INVENTION

Technical Problem

With the light field camera, depth information can be certainly obtained but the resolution of the resultant image decreases, which is a problem. To overcome the problem, the optical system should be modified as in the techniques disclosed in Patent Documents Nos. 6 and 7. Even if the optical system was modified, however, two image capturing systems would be needed or an image with no decrease in resolution and depth information could not be obtained at the same time.

An embodiment of the present invention provides an image capturing technique, by which an image with no decrease in resolution and depth information can be obtained at the same time using a different optical system and a different kind of signal processing than the ones adopted in the related art.

Solution to Problem

To overcome the problem described above, a light field camera according to an aspect of the present invention includes: an optical system; an image sensor that is arranged so as to receive an image that has been produced by the optical system; an image processor that generates image information based on a signal supplied from the image sensor; and a controller that controls the operation of the image sensor. The image sensor includes: a photoelectric conversion layer including a plurality of photosensitive cells; a reflective layer that reflects light that has been transmitted through the photoelectric conversion layer; a micro lens layer that includes a plurality of micro lenses that are arranged between the photoelectric conversion layer and the reflective layer; and a transmitted light controlling layer that is arranged between the photoelectric conversion layer and the reflective layer and that changes optical transmittance in accordance with an instruction given by the controller. The micro lens layer is arranged so that light that has been transmitted through one of the photosensitive cells and then reflected from the reflective layer is incident on the same photosensitive cell again. The controller controls the image sensor so that the image sensor performs a first image capturing session with the optical transmittance of the transmitted light controlling layer set to be a first value and a second image capturing session with the optical transmittance of the transmitted light controlling layer set to be a second value, which is different from the first value, respectively. The image processor generates the image information by performing an arithmetic operation including calculating the difference between a first signal generated by the image sensor through the first image capturing session and a second signal generated by the image sensor through the second image capturing session.

An image sensor according to another aspect of the present invention includes: a photoelectric conversion layer including a plurality of photosensitive cells; a reflective layer that reflects light that has been transmitted through the photoelectric conversion layer; a micro lens layer that includes a plurality of micro lenses that are arranged between the photoelectric conversion layer and the reflective layer; and a transmitted light controlling layer that is arranged between the photoelectric conversion layer and the reflective layer and that is able to change optical transmittance. The micro lens layer is arranged so that light that has been transmitted through one of the photosensitive cells and then reflected from the reflective layer is incident on the same photosensitive cell again.

This general and particular embodiment can be implemented as a system, a method, a computer program or a combination thereof.

Advantageous Effects of Invention

According to an aspect of the present invention, an image with no decrease in resolution and depth information can be obtained at the same time.

DESCRIPTION OF EMBODIMENTS

Figure 1:
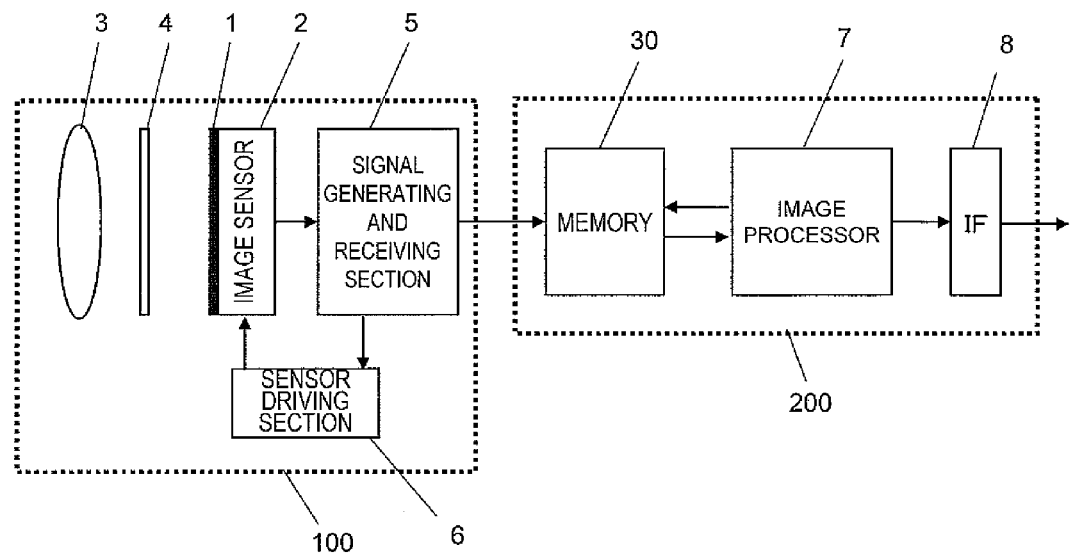
FIG. 1 A diagram illustrating a general configuration for an image capture device as a first exemplary embodiment.

Exemplary embodiments of the present invention are outlined as follows:

(1) A light field camera according to an aspect of the present invention includes: an optical system; an image sensor that is arranged so as to receive an image that has been produced by the optical system; an image processor that generates image information based on a signal supplied from the image sensor; and a controller that controls the operation of the image sensor. The image sensor includes: a photoelectric conversion layer including a plurality of photosensitive cells; a reflective layer that reflects light that has been transmitted through the photoelectric conversion layer; a micro lens layer that includes a plurality of micro lenses that are arranged between the photoelectric conversion layer and the reflective layer; and a transmitted light controlling layer that is arranged between the photoelectric conversion layer and the reflective layer and that changes optical transmittance in accordance with an instruction given by the controller. The micro lens layer is arranged so that light that has been transmitted through one of the photosensitive cells and then reflected from the reflective layer is incident on the same photosensitive cell again. The controller controls the image sensor so that the image sensor performs a first image capturing session with the optical transmittance of the transmitted light controlling layer set to be a first value and a second image capturing session with the optical transmittance of the transmitted light controlling layer set to be a second value, which is different from the first value, respectively. The image processor generates the image information by performing an arithmetic operation including calculating the difference between a first signal generated by the image sensor through the first image capturing session and a second signal generated by the image sensor through the second image capturing session.

(2) In one embodiment, the image processor calculates subject's depth information based on a differential signal representing the difference between the first and second signals.

(3) In one embodiment, the image processor generates the depth information by using signals representing multiple partial images that have been produced by the micro lens layer on the photoelectric conversion layer.

(4). In one embodiment, the image processor generates a normal image based on the first and second signals.

(5) In one embodiment, the image sensor includes an interconnect layer between the photoelectric conversion layer and the micro lens layer.

(6) An image sensor according to another aspect of the present invention includes: a photoelectric conversion layer including a plurality of photosensitive cells; a reflective layer that reflects light that has been transmitted through the photoelectric conversion layer; a micro lens layer that includes a plurality of micro lenses that are arranged between the photoelectric conversion layer and the reflective layer; and a transmitted light controlling layer that is arranged between the photoelectric conversion layer and the reflective layer and that is able to change optical transmittance. The micro lens layer is arranged so that light that has been transmitted through one of the photosensitive cells and then reflected from the reflective layer is incident on the same photosensitive cell again.

Hereinafter, embodiments of the present invention will be described with reference to the accompanying drawings. In the following description, any element shown in multiple drawings and having substantially the same function will be identified by the same reference numeral. It should be noted that a signal or information representing an image will be sometimes referred to herein as just an "image" in the following description.

(Embodiment 1)

First of all, an image capture device as a first embodiment of the present invention will be described. FIG. 1 is a block diagram illustrating a general configuration for a light field image capture device according to this embodiment (which will be simply referred to herein as an "image capture device"). The image capture device of this embodiment is a digital electronic camera and includes an image capturing section 100 and a signal processing section 200 that generates a signal representing an image (i.e., an image signal) based on the signal generated by the image capturing section 100.

The image capturing section 100 includes a solid-state image sensor 2 (which will be simply referred to herein as an "image sensor") with a number of photosensitive cells that are arranged on its imaging area, an optical lens 3 (imaging section) which produces an image on the photoelectric conversion section 1 of the image sensor 2, and an infrared cut filter 4. The image capturing section 100 further includes a signal generating and receiving section 5, which not only generates a fundamental signal to drive the image sensor 2 but also receives the output signal of the image sensor 2 and sends it to the signal processing section 200, and a sensor driving section 6 which drives the image sensor 2 in accordance with the fundamental signal generated by the signal generating and receiving section 5. The image sensor 2 is typically a CMOS sensor, which may be fabricated by known semiconductor device processing technologies. The signal generating and receiving section 5 and the sensor driving section 6 may be implemented as an LSI such as a CMOS driver. In this embodiment, the signal generating and receiving section 5 and the sensor driving section 6 have the function of the controller. Each photosensitive cell is typically a photodiode and outputs a photoelectrically converted signal by photoelectrically converting the light received.

The signal processing section 200 includes an image processor 7 which processes the output signal of the image capturing section 100 to generate an image with no decrease in resolution and depth information, a memory 30 which stores various kinds of data for use to generate the image signal, and an image interface (I/F) section 8 which sends out the image with no decrease in resolution and depth information thus generated to an external device. The image processor 7 may be a combination of a hardware component such as a known digital signal processor (DSP) and a software program for use to perform image processing involving the image signal generation. Alternatively, the image processor 7 may also be implemented as a dedicated piece of hardware. The memory 30 may be a known semiconductor memory such as a DRAM or an SRAM. And the memory 30 not only stores the signal supplied from the image capturing section 100 but also temporarily retains the image data that has been generated by the image processor 7 or compressed image data. These image data are then output to either a storage medium or a display section (neither is shown) by way of the image interface section 8.

The image capture device of this embodiment actually further includes an electronic shutter, a viewfinder, a power supply (or battery), a flashlight and other known components. However, description thereof will be omitted herein, because none of them are essential components that should be described in detail to allow the reader to understand how the present invention works. Also, this configuration is only an example. Thus, in this embodiment, additional components other than the image sensor 2 and the image processor 7 may be implemented as an appropriate combination of known elements.

With such a configuration adopted, the incoming light is passed through the optical lens 3 and the infrared cut filter 4 and then imaged and photoelectrically converted by the photoelectric conversion section 1 of the image sensor 2. Next, the photoelectrically converted signal that has been generated by photoelectric conversion is sent to, and stored in, the memory 30 via the signal generating and receiving section 5. Based on the photoelectrically converted signal stored in the memory 30, the image processor 7 generates an image with no decrease in resolution and depth information. The image with no decrease in resolution and depth information thus generated are then output to an external device through the image interface section 8.

Figure 2:
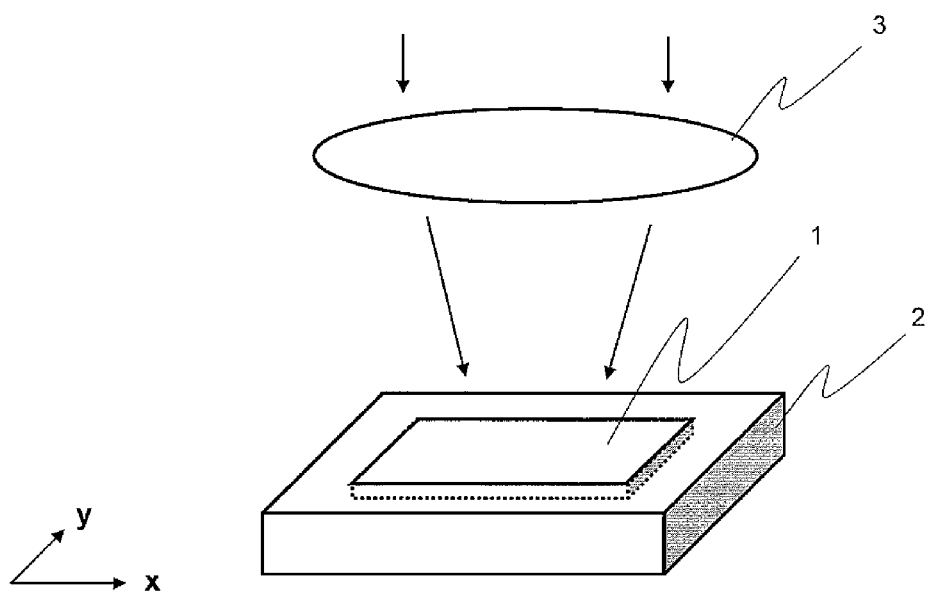
FIG. 2 A schematic representation illustrating a relative arrangement of an optical lens, a light-transmitting plate and an image sensor according to the first exemplary embodiment.

FIG. 2 schematically illustrates the relative arrangement of the optical lens 3, the image sensor 2 and the photoelectric conversion section 1 (which is built in the image sensor 2) in the image capturing section 100. It should be noted that illustration of the other elements is omitted in FIG. 2. Also, those elements illustrated in FIG. 2 are simplified ones and their sizes and shapes and the intervals between them are not necessarily to scale compared to the actual ones. For example, the optical lens 3 may be a lens unit that is a group of lenses but is drawn in FIG. 2 as a single lens for the sake of simplicity. In the following description, the xy coordinates shown in FIG. 2 will be used.

Figure 3:
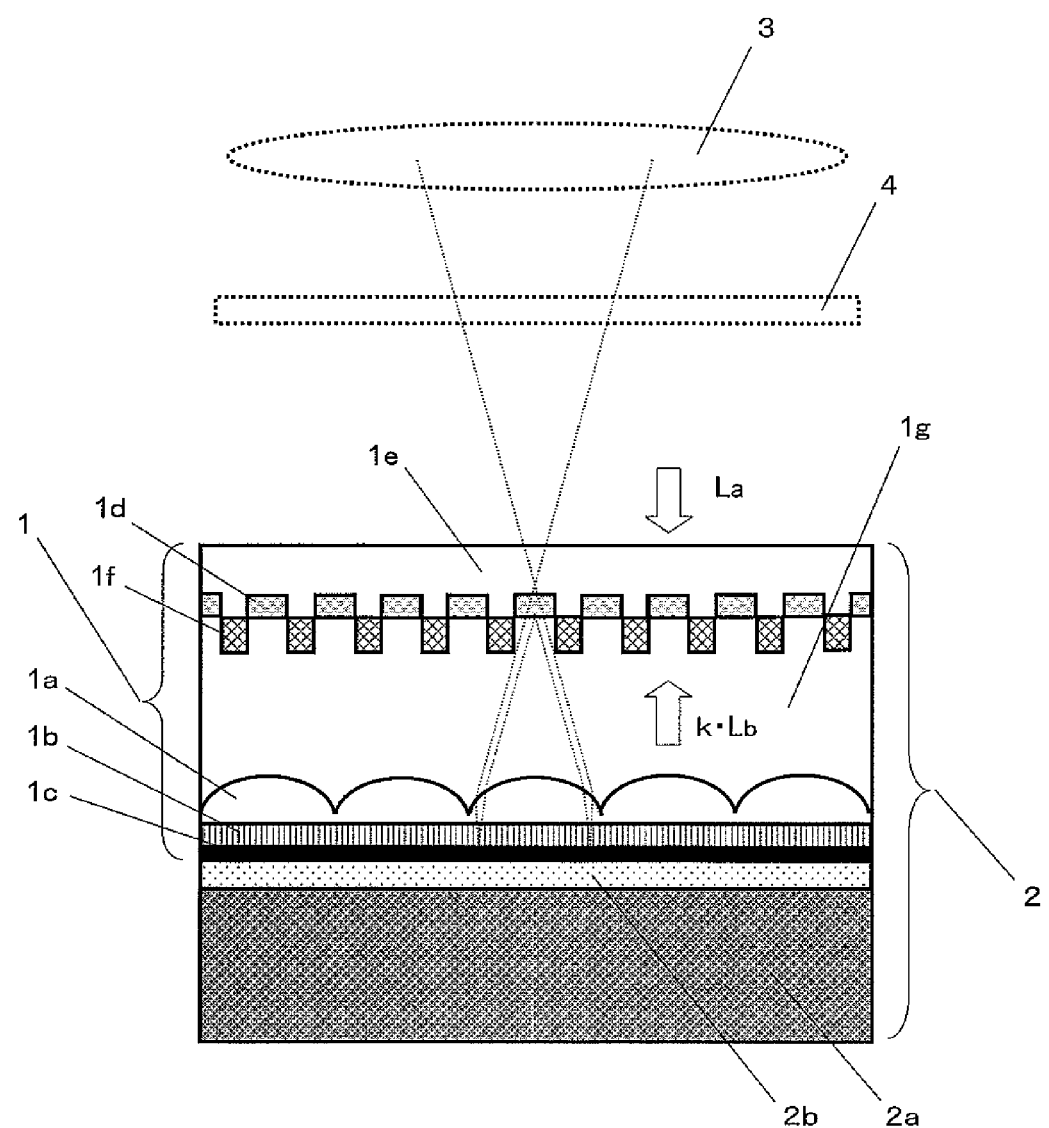
FIG. 3 A cross-sectional view of an image sensor according to the first exemplary embodiment.

FIG. 3 illustrates a partial cross section of the image sensor 2 according to this embodiment. In this embodiment, a CMOS image sensor of a so-called "backside illumination type" is used as the image sensor 2. The photoelectric conversion section 1 with an optical system (e.g., an array of micro lenses) is bonded to a fixing substrate 2a with an adhesive layer 2b. As shown in FIG. 3, the photoelectric conversion section 1 includes a photoelectric conversion layer with a plurality of photosensitive cells 1d, a micro lens layer with a plurality of micro lenses 1a that are arranged in a regular pattern, a transmitted light controlling layer 1b with a liquid crystal material to control the quantity of light transmitted, and a reflective layer 2c which is a light reflecting member. The photoelectric conversion section 1 further includes two semiconductor layers 1e and 1g and an interconnect layer 1f, all of which transmit incoming light.

By changing the alignment of liquid crystal molecules in accordance with a control signal supplied from the sensor driving section 6, the transmitted light controlling layer 1b realizes at least two different optical transmittance states. As will be described later, when the optical transmittance of the transmitted light controlling layer 1b has a first value, an image capturing session is carried out for the first time. And when the optical transmittance has a second value, an image capturing session is carried out for the second time. These image capturing sessions are controlled by the sensor driving section 6. Based on the photoelectrically converted signal obtained as a result of the second image capturing session, the image processor 7 generates a signal representing an image.

Figure 4:
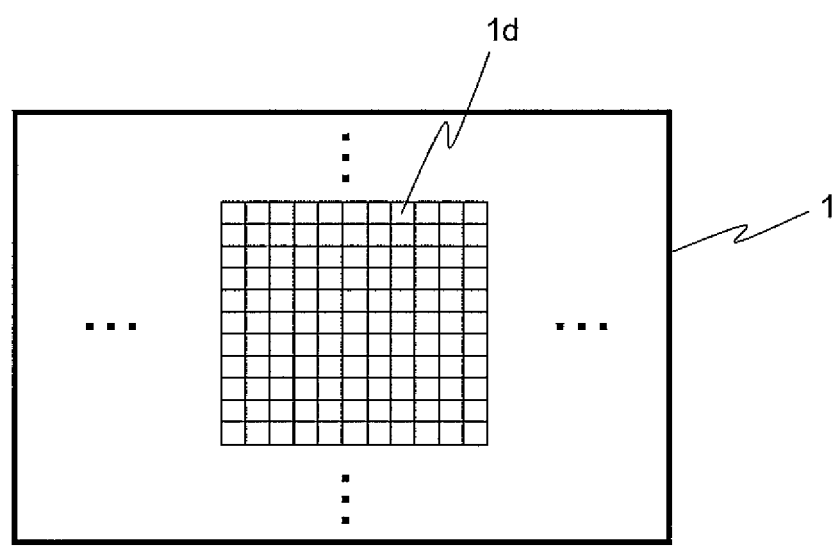
FIG. 4 A view illustrating an exemplary arrangement photosensitive cells according to the first exemplary embodiment.

FIG. 4 is a plan view illustrating an exemplary arrangement of those photosensitive cells 1d. As shown in FIG. 4, the photosensitive cells 1d are arranged two-dimensionally on the imaging area. Even though the photosensitive cells 1d are arranged to form a square lattice in the example shown in FIG. 4, the cells 1d may also be arranged in any other pattern. For example, those photosensitive cells 1d may also be arranged in an oblique lattice pattern by rotating this arrangement 45 degrees on a normal to the paper on which FIG. 4 is drawn.

With this arrangement adopted, the incoming light is transmitted through the lens 3 and the infrared cut filter 4, incident on the photoelectric conversion section 1 of the image sensor 2, and then photoelectrically converted by those photosensitive cells 1d. It should be noted, however, that not all of the incoming light is photoelectrically converted according to this embodiment. Due to the wavelength selectivity of silicon which is a general material to make the semiconductor layer 1e and the photosensitive cells 1d, a blue based light ray (with a relatively short wavelength) is absorbed well, but the closer to the wavelength range of the color red the wavelength of the incoming light is (i.e., the longer the wavelength of the incoming light), the lower the optical transmittance tends to be. That is why the red-based light ray is partially transmitted through the photosensitive cells 1d. The light that has been transmitted through any of the photosensitive cells 1d is passed through its associated micro lens 1a and the transmitted light controlling layer 1b and then reflected from the light reflecting layer 1c. On the way back, the light reflected from the light reflecting layer 1c is transmitted through the transmitted light controlling layer 1b and the micro lens 1a and then photoelectrically converted again by the same photosensitive cell 1d. In this manner, according to this embodiment, part of the incoming light is photoelectrically converted by the photosensitive cell 1d first of all. Next, the rest of the incoming light that has been just transmitted through the photosensitive cell 1d without being photoelectrically converted is further transmitted through the micro lens 1a and the transmitted light controlling layer 1b, reflected from the light reflecting layer 1c, and then incident on, and photoelectrically converting by, the same photosensitive cell 1d again. As a result, the photosensitive cell 1d performs photoelectrically conversion twice per image capturing session.

Thus, according to this embodiment, the property and arrangement of the micro lens layer are adjusted so that light that has been transmitted through a single photosensitive cell 1d when an image is captured is reflected from the reflective layer 1c and then incident on the same photosensitive cell 1d again. With this arrangement adopted, a normal image with a high resolution and depth information can be obtained at the same time by performing the processing to be described later. Ideally, every photosensitive cell 1d included in the image sensor 2 should be arranged to work that way. Due to design errors and other problems, however, some photosensitive cells 1d will not necessarily work that way.

Hereinafter, it will be described in further detail how to carry out image capturing and image processing according to this embodiment. The light that has come from the subject is transmitted through the optical lens 3 and the infrared cut filter 4 and then imaged on the photoelectric conversion section 1 of the image sensor 2. In this embodiment, the sensor driving section 6 controls the transmitted light controlling layer 1b so that an image is captured twice with the quantity of the light transmitted through the transmitted light controlling layer 1b changed. In the following description, the quantity of the incident light that has come through the lens 3 and the infrared cut filter 4 will be identified herein by La, the transmittance in a situation where the light is transmitted through the transmitted light controlling layer 1b both on the way toward, and on the way back from, the reflective layer will be identified herein by k, the reflectance of the light from the light reflecting layer 1c is supposed to be 100%, and the quantity of the light transmitted through the photosensitive cell 1d will be identified herein by Lb. Also, the photosensitive cell 1d is supposed to perform the photoelectric conversion only on the incoming light that has come from the lens 3 and the reflected light that has come from the micro lens 1a.

First of all, when an image capturing session is performed for the first time, an image is captured with the transmittance k at the transmitted light controlling layer 1b set to be a value k1 which is smaller than 50%. Then, light, of which the quantity is represented by (La+k1·Lb), is photoelectrically converted by the photosensitive cell 1d. Subsequently, with the transmittance k at the transmitted light controlling layer 1b set to be a value k2 which is larger than 50%, an image capturing session is performed for the second time. Then, light, of which the quantity is represented by (La+k2·Lb), is photoelectrically converted by the photosensitive cell. That is to say, supposing the photoelectrically converted signals obtained through the first and second image capturing sessions are G(1) and G(2), respectively, and signal levels corresponding to the light quantities La and Lb are identified by Las and Lbs, respectively, G(1) and G(2) can be represented by the following Equations (1) and (2):

$$G(1)=Las+k1 \cdot Lbs \quad (1)$$

$$G(2)=Las+k2 \cdot Lbs \quad (2)$$

Even though a still picture is supposed to be captured in the embodiment described above, this embodiment is also applicable to shooting a moving picture. In shooting a moving picture, however, the second image capturing session needs to be carried out at a rate that is high enough to regard the subject as standing still.

As a result of these two image capturing sessions, the difference in the quantity of light between the first and second image capturing sessions is represented by Lb(k2−k1). That is to say, as indicated by the following Equation (3), a differential signal G(2)−G(1) representing the difference between the photoelectrically converted signal G(1) obtained through the first image capturing session and the photoelectrically converted signal G(2) obtained through the second image capturing session is proportional to Lbs:

$$G(2)-G(1)=(k2-K1)Lbs \quad (3)$$

Since the signal Lbs is proportional the quantity of light Lb, the signal Lb representing the quantity of the light that has come from the micro lens 1a (i.e., image information) can be obtained based on the differential signal given by Equation (3). Once the image information of the light that has come from the micro lens 1a has been obtained, the image information of the light that has come from the lens 3 and the infrared cut filter 4 can also be obtained, because the transmittances k1 and k2 are already known. For example, by dividing k2·G(1)−k1·G(2) by (k2−k1), Las can be obtained. Since this signal Las represents the quantity of light La, it can be seen that image information of the light that has come from the infrared cut filter 4 can be obtained by adopting this arrangement.

As for information about the light that has come from the lens 3 and the infrared cut filter 4, there is no particular decrease in resolution, and therefore, the larger the number of pixels (i.e., the number of photosensitive cells) of the image sensor 2, the higher the resolution of the resultant image will be. On the other hand, the image information about the light that has come from the micro lens 1a corresponds to image information obtained from a so-called "light field camera". That is to say, even though its resolution is relatively low, the depth can still be calculated because the image information is obtained from the micro lens array. As can be seen, according to this embodiment, a normal image with no decrease in resolution and an image which has a low resolution but on which the depth can still be calculated can be obtained at the same time.

Figure 5:
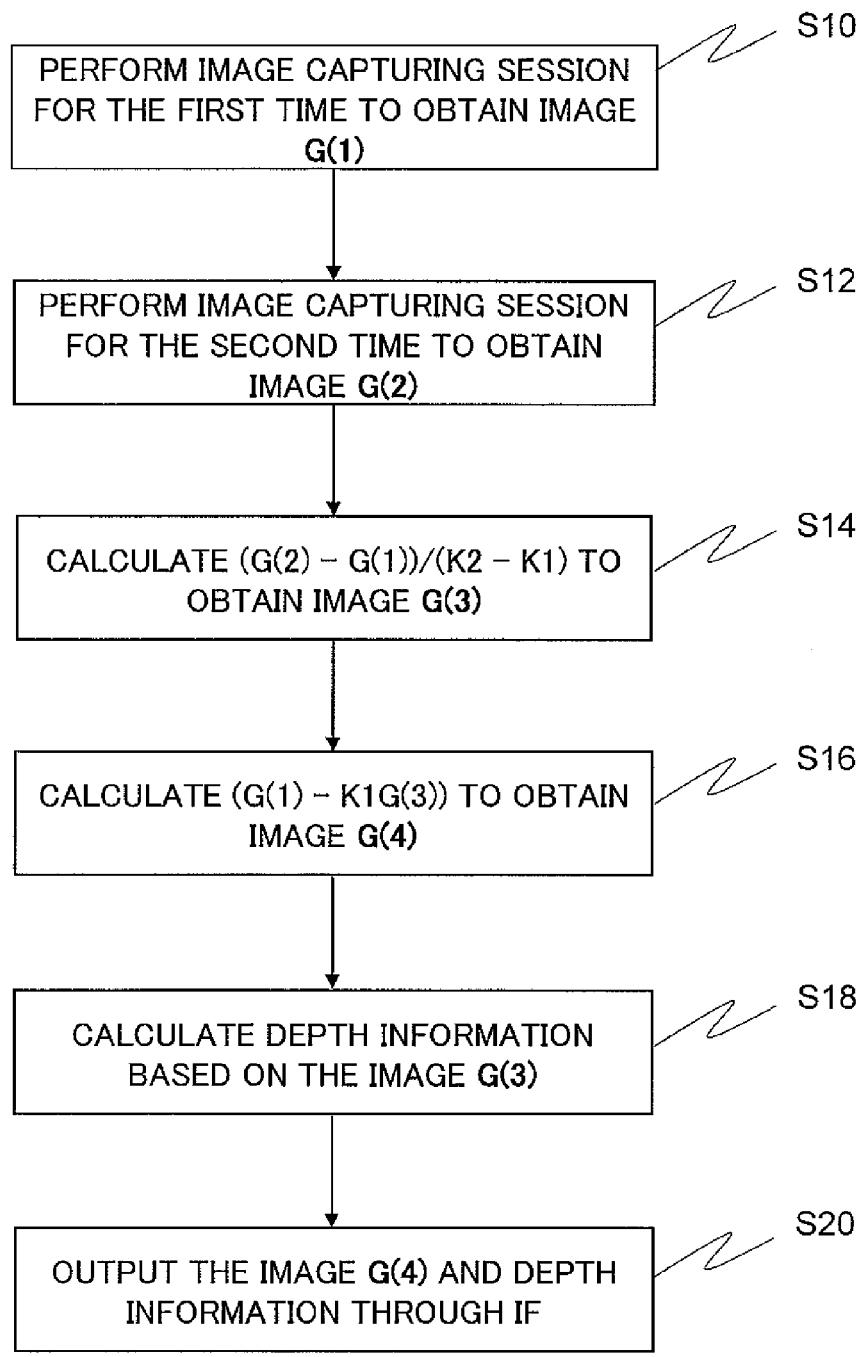
FIG. 5 A flowchart showing the flow of image capturing and signal processing according to the first exemplary embodiment.

Next, the specific flow of the image capturing and signal processing will be described with reference to FIG. 5. As the first step, an image capturing session is performed for the first time with the transmittance k of the transmitted light controlling layer 1b set to be a value k1 which is smaller than 50% (in Step S10). In this processing step, the photoelectrically converted signal G(1) obtained as a result of the image capturing session is transferred from the image sensor 2 to the memory 30 by way of the signal generating and receiving section 5. Next, as the second step, an image capturing session is performed for the second time with the transmittance k of the transmitted light controlling layer 1b set to be a value k2 which is larger than 50% (in Step S12). The photoelectrically converted signal G(2) obtained as a result of the image capturing session is also transferred from the image sensor 2 to the memory 30 by way of the signal generating and receiving section 5. Subsequently, as the third step, the image processor 7 divides the differential signal $(G(2)-G(1))$ by $(k2-k1)$ to obtain a quotient G(3) (in Step S14). That is to say, the image processor 7 performs an arithmetic operation represented by the following Equation (4):

$$G(3)=(G(2)-G(1))/(k2-k1)=Lbs \quad (4)$$

Thereafter, as the fourth step, the image processor 7 calculates $(G(1)-k1\ G(3))$, thereby generating a signal G(4) as represented by the following Equation (5) (in Step S16). Alternatively, the image processor 7 may also calculate $(G(2)-k2\ G(3))$, thereby generating a signal G(5) as represented by the following Equation (6):

$$G(4)=G(1)-k1\cdot G(3)=(Las+k1Lbs)-k1Lbs=Las \quad (5)$$

$$G(5)=G(2)-k2G(3)=(Las+k2Lbs)-k2Lbs=Las \quad (6)$$

Subsequently, as the fifth step, the image processor 7 performs the same processing as what is carried out by a known light field camera on the image G(3), thereby calculating depth information (in Step S18). That is to say, the image processor 7 performs triangulation based on a plurality of partial images produced by respective micro lenses on the photoelectric conversion layer, thereby calculating the depth. As for the processing carried out by a known light field camera, a detailed description will be omitted herein. Finally, as the last step, the signal G(4) or G(5) and depth information thus calculated are output via the image interface section 8 (in Step S20).

As described above, according to this embodiment, the group of photosensitive cells 1d, the micro lens array 1a, the transmitted light controlling layer and the light reflecting layer are arranged in this order in the direction in which the incoming light passes through the image sensor 2. In this arrangement, the incoming light that has come from the lens 3 is directly incident on the group of photosensitive cells of the image sensor 2. In addition, the light that has been transmitted through the group of photosensitive cells 1d is passed through the micro lens array 1a and the transmitted light controlling layer 1b, reflected from the light reflecting layer 1c and then incident on the group of photosensitive cells 1d again. Thus, by capturing the same image twice with the transmittance of the transmitted light controlling layer 1b changed, an image with no decrease in resolution and the depth information can be calculated just by performing simple arithmetic processing including calculating the difference between pixel signals, which is beneficial.

In the embodiment described above, the group of photosensitive cells 1d, the micro lens array 1a, the transmitted light controlling layer 1b and the light reflecting layer 1c are supposed to be arranged in this order in the direction in which the incoming light passes through the image sensor 2. However, this is only an example and this arrangement is not necessarily adopted. There is no problem as long as the transmitted light controlling layer 1b is arranged somewhere between the group of photosensitive cells 1d and the light reflecting layer 1c. Also, even though the transmitted light controlling layer 1b is supposed to include a liquid crystal material in the foregoing description, this is only an example and any other medium or structure may also be adopted as long as the quantity of the transmitted light can be controlled.

Furthermore, as for the image to be captured twice, when the quantity of the light transmitted is adjusted by the transmitted light controlling layer 1b, the optical transmittances are supposed to be k1 which is less than 50% and k2 which is more than 50% in the example described above. However, this is only an example and any other optical transmittances may be adopted unless they are equal to each other. Furthermore, in the embodiment described above, a non-colorized image sensor 2 has been described as an example. However, the technique of the present application is also applicable to a color image sensor in which color separating filters are arranged over the group of photosensitive cells 1d. In that case, even though only light transmitted through red-based color filters can be used, depth information can also be obtained based on the light reflected from the micro lenses and a color image with no decrease in resolution can also be obtained. Furthermore, the micro lens array 1a does not have to be made up of lenses that have the same optical properties in terms of the aperture size and focal length. For instance, the micro lens array may also be made up of multiple different kinds of lenses with different optical properties or liquid lenses with variable optical properties may also be used.

In the embodiments described above, image processing is supposed to be carried out by the image processor 7 that is built in the image capture device. However, that image processing may also be carried out by another device which is provided independently of the image capture device. For example, the same effects can also be achieved even by inputting the signal that has been obtained by an image capture device including the image capturing section 100 of the embodiment described above to another device (e.g., image processing device) and by getting a program defining the signal arithmetic processing described above executed by a computer built in that image processing device.

INDUSTRIAL APPLICABILITY

The technique of the present application can be used effectively in every camera that ever uses a solid-state image sensor, and may be used in digital cameras, digital camcorders and other consumer electronic cameras and in industrial surveillance cameras, to name just a few.

REFERENCE SIGNS LIST 1 photoelectric conversion section including image sensor's optical system
1a micro lens
1b transmitted light controlling layer
1c light reflecting layer
1d photosensitive cell
1e semiconductor layer
1f interconnect layer
2 solid-state image sensor
2a fixing substrate
2b adhesive layer
3 lens
4 infrared cut filter
5 signal generating and receiving section
6 sensor driving section
7 image processor
8 interface section
10 photosensitive cell
30 memory
100 image capturing section
200 signal processing section

The invention claimed is:

1. A light field image capture device comprising:
an optical system;
an image sensor that is arranged so as to receive an image that has been produced by the optical system;
an image processor that generates image information including depth information based on a signal supplied from the image sensor; and
a controller that controls the operation of the image sensor,
wherein the image sensor includes:
a photoelectric conversion layer including a plurality of photosensitive cells;
a reflective layer that reflects light that has been transmitted through the photoelectric conversion layer;
a micro lens layer that includes a plurality of micro lenses that are arranged between the photoelectric conversion layer and the reflective layer; and
a transmitted light controlling layer that is arranged between the photoelectric conversion layer and the micro lens layer or between the micro lens layer and the reflective layer and that changes optical transmittance in accordance with an instruction given by the controller,
wherein the micro lens layer is arranged so that light that has been transmitted through one of the photosensitive cells and then reflected from the reflective layer is incident on the same photosensitive cell again,
wherein the controller controls the image sensor to perform a first image capturing session with the optical transmittance of the transmitted light controlling layer set to be a first value and a second image capturing session with the optical transmittance of the transmitted light controlling layer set to be a second value, which is different from the first value,
wherein the optical transmittances of the micro lenses are constant in the first and second image capturing sessions, and
wherein the image processor generates the image information including depth information by performing an arithmetic operation including calculating the difference between a first signal generated by the image sensor through the first image capturing session and a second signal generated by the image sensor through the second image capturing session.

2. The light field image capture device of claim 1, wherein the image processor calculates subject's depth information based on a differential signal representing the difference between the first and second signals.

3. The light field image capture device of claim 2, wherein the image processor generates the depth information by using signals representing multiple partial images that have been produced by the micro lens layer on the photoelectric conversion layer.

4. The light field image capture device of claim 1, wherein the image processor generates a normal image based on the first and second signals.

5. The light field image capture device of claim 1, wherein the image sensor includes an interconnect layer between the photoelectric conversion layer and the micro lens layer.

6. An image sensor comprising:
a photoelectric conversion layer including a plurality of photosensitive cells;
a reflective layer that reflects light that has been transmitted through the photoelectric conversion layer;
a micro lens layer that includes a plurality of micro lenses that are arranged between the photoelectric conversion layer and the reflective layer; and
a transmitted light controlling layer that is arranged between the photoelectric conversion layer and the micro lens layer or between the micro lens layer and the reflective layer and that is able to change optical transmittance,
wherein the micro lens layer is arranged so that light that has been transmitted through one of the photosensitive cells and then reflected from the reflective layer is incident on the same photosensitive cell again,
wherein the image sensor, in response to an instruction from a controller, performs a first image capturing session with the optical transmittance of the transmitted light controlling layer set to be a first value and a second image capturing session with the optical transmittance of the transmitted light controlling layer set to be a second value, which is different from the first value, and outputs a first signal generated through the first image capturing session and a second signal generated through the second image capturing session, and
wherein the optical transmittances of the micro lenses are constant in the first and second image capturing sessions.

* * * * *